(12) United States Patent
Shi (10) Patent No.: US 10,001,509 B2
(45) Date of Patent: Jun. 19, 2018

(54) SEMICONDUCTOR TESTING FIXTURE AND FABRICATION METHOD THEREOF

(71) Applicant: TONGFU MICROELECTRONICS CO., LTD., Nantong (CN)

(72) Inventor: Lei Shi, Nantong (CN)

(73) Assignee: TONGFU MICROELECTRONICS CO., LTD., Nantong (CN)

( * ) Notice: Subject to any disclaimer, the term of this patent is extended or adjusted under 35 U.S.C. 154(b) by 121 days.

(21) Appl. No.: 14/927,693

(22) Filed: Oct. 30, 2015

(65) Prior Publication Data
US 2016/0124019 A1    May 5, 2016

(30) Foreign Application Priority Data

Oct. 30, 2014  (CN) .......................... 2014 1 0605255
Oct. 30, 2014  (CN) .......................... 2014 1 0606025
Oct. 30, 2014  (CN) .......................... 2014 1 0607155

(51) Int. Cl.
*G01R 1/067* (2006.01)
*G01R 3/00* (2006.01)
*G01R 1/073* (2006.01)

(52) U.S. Cl.
CPC ............ *G01R 3/00* (2013.01); *G01R 1/06738* (2013.01); *G01R 1/06761* (2013.01); *G01R 1/07307* (2013.01)

(58) Field of Classification Search
CPC .............. G01R 31/2827; G01R 31/013; G01R 1/06733; G01R 1/07342; G01R 1/07307; G01R 1/06761; G01R 1/06738; G01R 1/067; G01R 31/28; G01R 31/2886; G01R 31/2831; G01R 31/308; G01R 19/0046; H02H 3/20

USPC ............ 324/500, 537, 549, 754.03, 755.02, 324/762.01, 750.24; 29/825
See application file for complete search history.

(56) References Cited

U.S. PATENT DOCUMENTS

| | | | | |
|---|---|---|---|---|
| 5,541,516 A * | 7/1996 | Rider | ........................ | G01V 3/08 324/326 |
| 5,635,841 A * | 6/1997 | Taylor | ..................... | F02P 17/00 324/380 |
| 6,225,809 B1 * | 5/2001 | Watano | ................... | G01N 27/60 324/464 |
| 2002/0113609 A1 * | 8/2002 | Noda | ................... | G01R 1/06738 324/755.01 |
| 2011/0057678 A1 * | 3/2011 | Kato | ..................... | C03C 14/004 324/756.03 |

(Continued)

FOREIGN PATENT DOCUMENTS

| CN | 1781028 A | 5/2006 |
|---|---|---|
| CN | 101713790 B | 5/2012 |

(Continued)

*Primary Examiner* — Thang Le
(74) *Attorney, Agent, or Firm* — Anova Law Group, PLLC (57) ABSTRACT

A semiconductor testing fixture is provided. The semiconductor testing fixture includes a substrate having a plurality of testing regions; and a plurality of testing probes with a predetermined distribution pattern formed on the substrate in each of the plurality of testing regions. Etch of the testing probes comprises a first testing tip; an insulation layer formed on a side surface of the first testing tip; and a second testing tip being coaxial with the first testing tip and surrounding the first testing tip formed on a side surface of the insulation layer.

18 Claims, 7 Drawing Sheets

(56) References Cited

U.S. PATENT DOCUMENTS

| | | | | |
|---|---|---|---|---|
| 2012/0013360 A1* | 1/2012 | Oh | ............................ | G01R 3/00 |
| | | | | 324/763.01 |
| 2012/0319711 A1* | 12/2012 | Hung | .................. | G01R 1/07371 |
| | | | | 324/750.16 |
| 2012/0323513 A1* | 12/2012 | Prance | .................. | G06K 9/0002 |
| | | | | 702/65 |
| 2013/0015440 A1* | 1/2013 | Dang | ................ | H01L 21/76898 |
| | | | | 257/48 |
| 2014/0266280 A1* | 9/2014 | Yeh | ........................... | G01R 3/00 |
| | | | | 324/755.11 |
| 2016/0084876 A1* | 3/2016 | Dang | ................... | G01R 1/0408 |
| | | | | 324/755.03 |

FOREIGN PATENT DOCUMENTS

| | | |
|---|---|---|
| CN | 101957389 B | 9/2013 |
| JP | 5470142 B2 | 4/2014 |

\* cited by examiner

SEMICONDUCTOR TESTING FIXTURE AND FABRICATION METHOD THEREOF

CROSS-REFERENCES TO RELATED APPLICATIONS

This application claims the priority of Chinese patent application No. 201410605255.0, filed on Oct. 30, 2014; Chinese patent application No. 201410606025.6, filed on Oct. 30, 2014; and Chinese patent application No. 201410607155.1, filed on Oct. 30, 2014, the entirety of all of which are incorporated herein by reference.

FIELD OF THE INVENTION

The present invention generally relates to the field of semiconductor testing technology and, more particularly, relates to semiconductor testing fixtures and fabrication processes thereof.

BACKGROUND

A semiconductor testing process is used to test the electrical characteristics and functionalities of packaged IC products after IC packaging processes so as to ensure the functional completeness of the IC products. Further, the testing process also includes categorizing the tested IC products according to their electrical performance. The testing results are used as the evaluation basis for grading the IC products. Finally, the testing process also includes checking the appearance of the IC products. An electrical testing, one aspect of the semiconductor testing process, is mainly focused on a variety of electrical parameters of the IC products. The electrical testing ensures that the IC products are able to function properly.

The conventional two-point testing method, such as Kelvin testing, etc., often utilizes double parallel top-probes or double parallel gold-fingers. The top-probes and the gold-fingers have a few limitations.

First, the manufacturing accuracy is relatively low. With the continuous shrinking of the critical dimension of semiconductor devices, the size of the tested terminals and/or the distance between different tested terminals are also continuously shrunk. To match such size and distance shrinkage, the limitations of the distribution of the conventional double top-probes and the double gold-fingers become more prominent. Thus, the accuracy requirements has become more and more strict. Sometimes, it is even unable to use the distribution with double top-probes or double gold-fingers.

Second, the structural strength is relatively low. To achieve a two-point testing in the limited space on the tested terminal, the top-probes and the gold-fingers have to be thinner and thinner. Thus, the mechanical strength of the top-probes and the gold fingers is correspondingly lower and lower.

Third, the life span is relatively short. The conventional top-probes and gold-fingers are easily worn. Especially, when the accuracy requirements are relatively high and the mechanical strength is relatively low, the wear may be more severe; and the life span of the testing fixture is reduced.

Fourth, the testing accuracy is relatively low. To adapt to the requirements of the miniaturization of semiconductor devices, the resistance of the top-probes and gold-fingers with the smaller and smaller size is continuously increased. When the top-probes or gold-fingers are used to test a relatively large current, a relatively large voltage drop is generated. The relatively large voltage drop would affect the testing results. Further, it is easy for the parallel distributed top-probes or gold-fingers to generate a distance difference. The distance difference would also affect the testing results. Further, to reduce the distance between two probes, the conventional double top-probes are usually distributed with inclining faces back-to-back. It is easy for the probes to spin out from the tested terminal because of the torque force of the spring in testing apparatus. Thus, the testing accuracy is affected. The disclosed device structures and methods are directed to solve one or more problems set forth above and other problems.

BRIEF SUMMARY OF THE DISCLOSURE

One aspect of the present disclosure includes a semiconductor testing fixture. The semiconductor testing fixture includes a substrate having a plurality of testing regions; and a plurality of testing probes with a pre-determined distribution pattern formed on the substrate in each of the plurality of testing regions. Etch of the testing probes comprises a first testing tip; an insulation layer formed on a side surface of the first testing tip; and a second testing tip being coaxial with the first testing tip and surrounding the first testing tip formed on side surface of the insulation layer.

Another aspect of the present disclosure includes a method for forming a semiconductor testing fixture. The method includes providing a substrate having a plurality of testing regions; and forming a plurality of testing probes with a pre-determined distribution pattern on the substrate in each of the plurality of testing regions. Etch of the testing probes comprises a first testing tip; an insulation layer formed on a side surface of the first testing tip; and a second testing tip being coaxial with the first testing tip and surrounding the first testing tip formed on side surface of the insulation layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
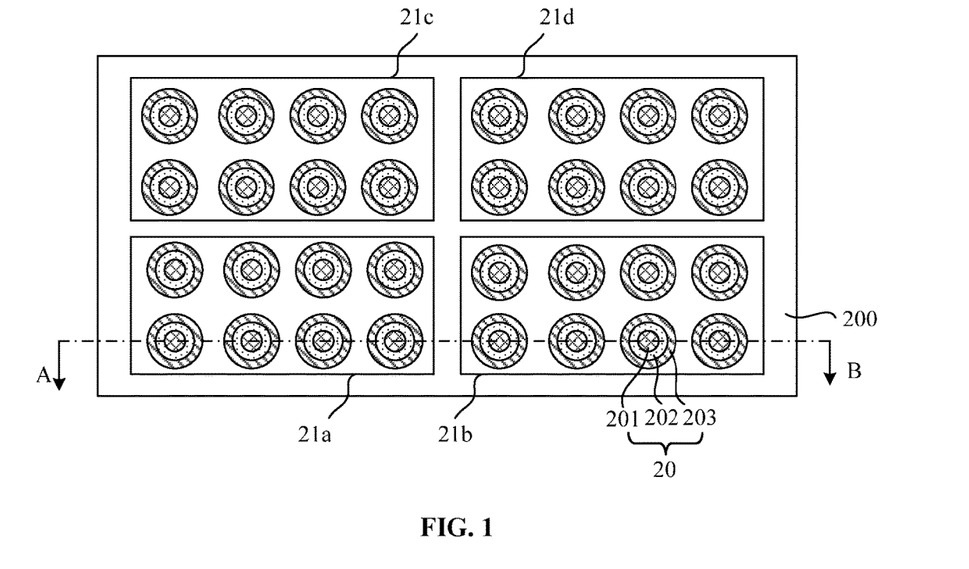
FIGS. 1~4 illustrate exemplary semiconductor testing fixtures consistent with the disclosed embodiments.
Figure 2:
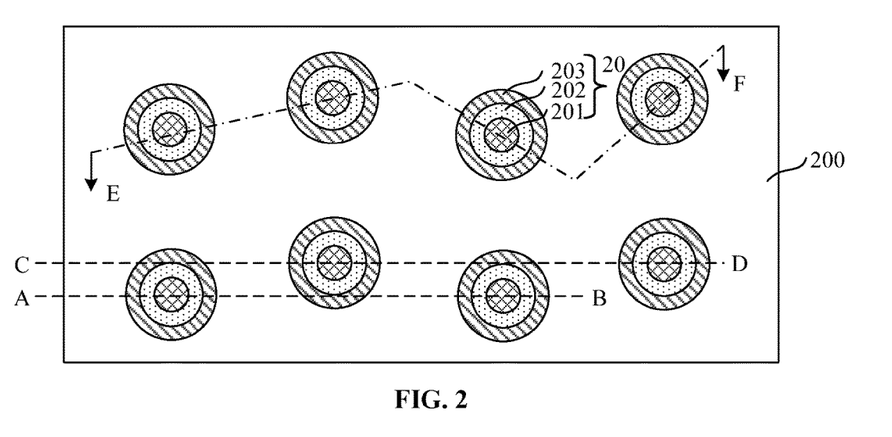
Figure 3:
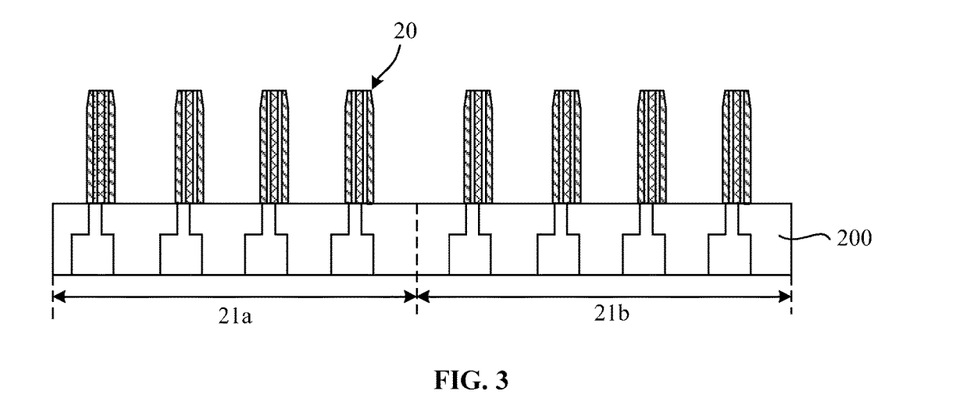

FIGS. 1~4 illustrate exemplary semiconductor testing fixtures consistent with the disclosed embodiments. FIG. 3 is a cross-sectional view of the structure illustrated in FIG. 1 along the AB direction. The right-half or the left half of FIG. 3 may refer to a cross-sectional view of the structure illustrated in FIG. 2 along the EF direction.

As shown in FIGS. 1~3, the semiconductor testing fixture includes a substrate 200 having a plurality of testing regions. The number of the testing regions may be any appropriate value. In one embodiment, for illustrative purposes, a first testing region 21a, a second testing region 21b, a third testing region 21c, and a fourth testing region 21d are shown in FIG. 1.

A plurality of testing probes 20 may be formed on the surface of the substrate 200 in each of the plurality of testing regions. The number of testing probes 20 in a different testing region may be as same, or different. In one embodiment, the numbers of the testing probes 20 in different testing regions are same. That is, as shown in FIG. 1, the first testing region 21a, the second testing region 21b, the third testing region 21c and the fourth testing region 21d may have a same number of testing probes 20. The number of the testing probes 20 in each of the plurality of testing region may be greater than one; and may be determined according to the number of the tested terminals of a tested packaging IC.

The plurality of testing probes 20 in each of the plurality of testing regions may be distributed with an appropriate predetermined pattern. In one embodiment, the plurality of testing probes 20 is distributed as at least one row. For example, as show in FIG. 1, the eight testing probes 20 are distributed as two rows. The centers of the odd number testing probes 20 in each row or column and the centers of the even number testing probes 20 may be on a same line.

In certain other embodiments, as shown in FIG. 2, the rows of the plurality of testing probes 20 in a testing region may have a staggered arrangement. The connect line of the centers of the even number testing probes 20 (line AB) may be referred as a first line. The connect line of the centers the odd number testing probes 20 (line CD) may be referred as second line. The staggered arrangement may refer that the first line and the second line may be parallel, and not overlap. The vertical distance between the first line and the second line may be in a range of approximately 0.5 μm~5 μm.

Such a staggered arrangement may aid to have more number of the testing probes 20 in a same area; and the distance between adjacent testing probes 20 may be reduced. Thus, it may be able to perform an electrical testing on the tested terminals with a substantially small distance.

The plurality of the testing probes 20 in each testing region may be used to test a plurality of the tested terminals of a packaging structure. That is, each testing region may be used to test one packaging structure. Thus, the semiconductor testing fixture may be able to test a plurality of tested packaging structures simultaneously; and the testing efficiency may be improved.

In certain other embodiments, the number and distribution of the plurality of testing probes 20 in each of the plurality of testing regions may be different to test different packaging structures. For example, in one embodiment, the row numbers of adjacent testing regions may be different; or the numbers of the testing probes in each row of adjacent testing regions may be different; or the distribution of the testing probes in adjacent testing regions may be different.

Further, as shown in FIG. 1~2, each of the plurality of testing probes 20 may include a first testing tip 201, a second testing tip 203; and an insulation layer 202 between the first testing tip 201 and the second testing tip 203. The first testing tip 201 and the second testing tip 203 may be coaxial; and the second testing tip 203 may surround the first testing tip 201.

Figure 4:
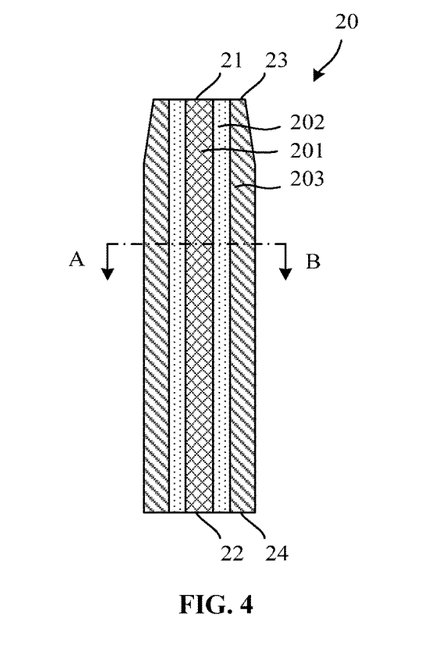

FIG. 4 illustrated the detailed structure of one of the plurality of testing probes 20 illustrated in FIG. 1 and FIG. 2. As shown in FIG. 4, the testing probe 20 may include the first testing tip 201. The first testing tip 201 may include a first tip body (not labeled). One end of the first tip body may be configured as a first testing head 21; and the other end of the first tip body may be configured as a first connecting end 22. Further, the testing probe 20 may also include an insulation layer 202 formed on the side surface of the first tip body.

Further, the testing probe 20 may also include a second testing tip 203 formed on the side surface of the dielectric layer 202 and may surround the first testing tip 201. The second testing tip 202 and the first testing tip 201 may be coaxial. The second testing tip 202 may include a second tip body (not labeled). One end of the second tip body may be configured a second testing head 23, and the other end of the second tip body may be configured as a second connecting end 24. The surface of the second testing head 23 may level with the surface of the first testing head 21. When the testing probe 20 is used to perform an electrical testing, the first testing head 21 and the second testing head 23 may contact with a surface of the tested terminal of the packaging structure.

Further, as shown in FIGS. 1~4, in one embodiment, the first testing tip 201 is a cylinder. Correspondingly, the cross-sectional view of the first testing tip 201 is a circle. The cross-sectional view of the insulation layer 202 is a circular ring. The cross-sectional view of the second testing tip 203 is also a circular ring. In certain other embodiments, the cross-sectional view of the first testing tip 201 may be any other appropriate shape, such as a triangle, or square, etc.

In one embodiment, the plurality of testing probes 20 may be formed by a microfabrication process. Thus, the diameter of the first testing tip 201 may be substantially small. In one embodiment, the diameter of the first testing tip 201 may be in a range of approximately 100 nm~500 μm. For example, the diameter of the first testing tip 201 is in a range of approximately 200 nm~50 μm.

Correspondingly, the width of the insulation layer 202 and the width of the second testing tip may also be substantially small. In one embodiment, the width of the insulation layer 202 may be in a range of approximately 80 nm~400 μm. For example, the width of the second testing tip 203 is in a range of approximately 100 nm~10 μm. The width of the second testing tip 203 may be in a range of approximately 60 nm~300 μm. For example, the width of the second testing tip 203 is in a range of approximately 90 nm~25 μm. In certain other embodiments, according to the testing requirements, the diameter of the first testing tip 201, the width of the insulation layer 202 and the width of the second testing tip 203 may any other appropriate value.

The first testing tip 201 and the second testing tip 203 may be made of any appropriate material, such as Cu, Au, W, or alloy material, etc. The first testing tip 201 and the second testing tip 203 may be made of a same material, or different materials.

The insulation layer 202 may be used to electrically insulate the first testing tip 201 and the second testing tip 203. As shown in FIGS. 3~4, one end surface of insulation layer 202 may level with the first testing head 21 of the first testing tip 201 and the second testing head 23 of the second testing tip 202. The other end surface of the insulation layer 202 may level with the first connecting end 22 of the first testing tip 201 and the second connecting end 24 of the second testing tip 203.

Further, there may be no gap between the first testing head 21 of the first testing tip 201 and the second testing head 23 of the second testing tip 203. Such a structure may prevent the first testing head 21 of the first testing tip 201 and the second testing head 23 of the second testing tip 203 from deforming during a testing process. If there is a gap between the first testing head 21 of the first testing tip 201 and the second testing head 23 of the second testing tip 203, the first testing head 21 of the first testing tip 201 and the second testing head 23 of the second testing tip 203 may be deformed by external forces during the testing process. The deformation may cause the first testing head 21 of the first testing tip 201 and the second testing head 23 of the second testing tip 203 to be electrically connected. Accordingly, the testing accuracy may be affected.

The insulation layer 202 may be a single layer structure, or a multiple-stacked structure. The insulation layer 202 may be made of an insulation material, such as one or more of silicon oxide, silicon nitride, silicon oxynitride, and silicon carbonitride, etc. The insulation layer 202 may also be made of resin material, such as epoxy, polyimide, polyethylene, benzocyclobutene, or polybenzoxazole, etc.

Further, as shown in FIGS. 3~4, the end of the testing probe 20 having the first testing head 21 and the second testing head 23 may be tapered. That is, along a direction from the second connecting end 24 to the second testing head 23, the width of the portion of the second tip body near the second testing head 23 of the second testing tip 203 may be continuously reduced. Such a shape may increase the distance between adjacent testing probes 20 when the semiconductor structure is used to perform a testing.

In one embodiment, a dielectric layer (not shown) may be formed on the surface of the substrate 200. The dielectric layer may fill the spaces between adjacent testing probes 20; and cover portions of the side surfaces of the second testing tips 203. The dielectric layer may be used to electrically insulate the adjacent testing probes 20; and increase the mechanical strength the testing probes 20.

The dielectric layer may be made of any appropriate material, such as silicon oxide, silicon nitride, silicon oxynitride, silicon carbonitride, or resin material, etc. The thickness of the dielectric layer may be approximately ¼~⅔ of the height of the testing probes 20.

In certain other embodiments, a dielectric layer (not shown) may be formed on the surface of the substrate 200. The dielectric layer may fill the space between adjacent testing probes 20; and cover the entire side surfaces of the second testing tips 203. The top surface of the dielectric layer may level with the top surfaces of the testing probes 20.

Further, a transition board (not shown) may be formed on the dielectric layer. The transition board may be used as a transition structure between the testing probes 20 and the tested terminals during a testing process. Such a transition board may cause an electrical testing to be convenient. Further, the transition board may cause the testing probes 20 to indirectly contact with the tested terminals. Thus, it may prevent the damage to the terminals, and/or avoid the deformation of the testing probes 20, caused by a direct contact.

The transition board may include an insulation layer and a plurality of metal blocks in the insulation layer. The insulation layer may be disposed on the dielectric layer. The insulation layer may be used to electrically insulate the metal blocks and fix the corresponding metal blocks. The bottom surfaces of the metal blocks may contact with the top surfaces of the testing probes 20; and the top surfaces of the metal blocks may contact with the surface of the tested terminals.

In one embodiment, the testing probe 20 may be used to test a resistance or a relatively large current. One end of the testing probe 20 may contact with a tested terminal. That is, the first testing head 21 of the first testing tip 201 and the second testing head 23 of the second testing tip 203 may contact with the surface of the tested terminal. Then, a testing voltage may be applied between the first testing tip 201 and the second testing tip 203; and the current passing through the first testing tip 201, the second testing tip 203 and the tested terminal may be measured. According to the applied voltage and the measured current, the resistance may be obtained.

When the testing probe 20 is used to perform a resistance testing, because the first testing tip 201 and the second testing tip 203 may be coaxial, the current passing through the first testing tip 201 may be distributed radially, and flow to the second testing tip 201. That is, the current flowing through the circular region (the region contacts with the end surface of the insulation layer 202) of the tested terminal may be uniform. Thus, the testing accuracy may be improved.

In certain other embodiments, the testing probe 20 may be used to perform other type of electrical testing. For example, the semiconductor testing fixture having a plurality of testing probes 20 may be used to perform an electrical testing. The testing current may flow from the first testing tip 201 or the second testing tip 203 of one testing probe 20 to the first testing tip 201 or the second testing tip 203 of anther testing probe 20. Alternatively, the testing current may flow from the first testing tip 201 and the second testing tip 203 of one testing probe 20 to the first testing tip 201 and the second testing tip 203 of another testing probe 20.

A signal transmitting circuit may be formed in the substrate 200. The signal transmitting circuit may include first input terminals (not labeled), second input terminals (not labeled), first output terminals (not labeled) and second output terminals (not labeled), etc. For each testing probe 20, the first output terminal may be electrically connected with the first connecting end (not labeled) of the first testing tip 201; and the second output terminal may be electrically connected with the second connecting end (not labeled) of the second testing tip 203.

The first input terminals and the second input terminals may be electrically connected with an external testing circuit. The external testing circuit may be used to provide testing signals. The signal transmitting circuit may be used to transmit the testing signals provided by the external testing circuit to the first testing tips 201 and the second testing tips 203; and transmit the electrical signals obtained from the testing process back to the external testing circuit. The external testing circuit may process the received electrical signals; and the testing parameters may be obtained.

The substrate 200 may be made of the any appropriate material. In one embodiment, the substrate 200 is made of PCB resin. Further, first metal lines (not labeled) and second metal lines (not labeled) may be formed in the substrate 200. The first input terminals and the first output terminals may be electrically connected through the first metal lines. The second input terminals and the second output terminals may be electrically connected through the second metal lines.

In one embodiment, the substrate 200 may have a front surface and a facing back surface. The back surface of the substrate 200 may include interface regions. The plurality of first output terminals and the plurality of second output terminals may be disposed on the front surface of the substrate 200; and may be corresponding to the positions of the first testing tips 201 and the second testing tips 203. The plurality of first input terminals and the plurality of second input terminals may be integrated in the interface regions on the back surface of the substrate 200. Thus, the plurality of first input terminals and the plurality of second input terminals may be connected with the external testing circuit through one or more interfaces; and the interface circuit between the testing fixture and the external testing circuit may be simplified.

In one embodiment, the substrate 200 may be formed by compressing a plurality of PCB boards. Each PCB board may include a plurality of interconnect structures. Each interconnect structure may include a plurality of through-board structures and metal layers formed on the surface of the PCB board and electrically connecting with through-board structures. When the plurality of PCB boards are compressed to form the substrate 200, the plurality of interconnect structures may form the first metal lines and the second metal lines. Thus, the plurality of first input terminals and the plurality of second input terminals may be integrated in the interface regions on the back face of the substrate 200.

In certain other embodiments, the substrate 200 may have a front surface and a facing back surface. The back surface of the substrate 200 may include interface regions. The plurality of first output terminals and the plurality of second output terminals may be disposed on the front surface of the substrate 200. A plurality of first through-board interconnect structures and a plurality of second through-board interconnect structures penetrating through the substrate 200 may be formed in the substrate 200. The first input terminals and the first output terminals may be electrically connected through the first through-board interconnect structures; and the second input terminals and the second output terminals may be electrically connected through the second through-board interconnect structures.

Further, a plurality of first redistribution metal layers and a plurality of second redistribution layers may be formed on the back surface of the substrate 200. One end of the first redistribution metal layer may be electrically connected with the first input terminal; and the other end of the first redistribution metal layer may be disposed in the interface region. One end of the second redistribution metal layer may be electrically connected with the second terminal; and the other end of the second redistribution metal layer may be disposed in the interface region. The first redistribution metal layers and the second redistribution layers may be electrically connected with the external testing circuit through one or more interfaces.

In certain other embodiments, a testing circuit (not shown) may be formed in the substrate 200. The testing circuit may include a first signal terminal and a second signal terminal. The first signal terminal may be electrically connected with the first connecting end of the first testing tip 201. The second signal terminal may be electrically connected with the second connecting end of the second testing tip 201. When the semiconductor testing fixture is used to perform a test, testing signals, such as voltage signals or current signals, etc., may be applied onto the first testing tip 201 and the second testing tip 203; and received signals, such as current signals, etc., may be processed to obtain the testing parameters, such as resistance, etc.

Figure 5:
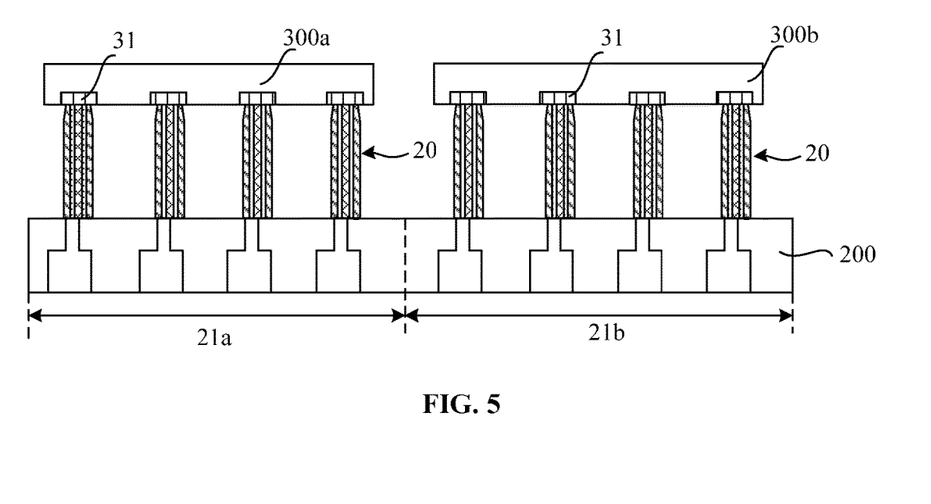
FIG. 5 illustrates an exemplary semiconductor testing fixture used in a testing process consistent with the disclosed embodiment.

FIG. 5 illustrates a structure corresponding to an electrical testing utilizing the semiconductor testing fixture illustrated in FIG. 1 or a semiconductor testing fixture with testing regions having the structure illustrated in FIG. 2. As show in FIG. 5, at the beginning of the testing process, the semiconductor testing fixture is installed in a testing apparatus; and then a first tested packaging structure 300a and a second tested packaging structure 300b may be disposed on the first testing region 21a and the second testing region 21b, respectively. The first tested packaging structure 300a and the second tested packaging structure may all include a plurality of tested terminals 31. The tested terminals 31 may be contacting pads or soldering pads, etc. Portions of the surfaces of the tested terminals 31 may be electrically connected with the test heads of the testing probes 20, including the first testing heads of the first testing tips 201, and the second testing heads of the second testing tips 203. Then, testing signals may be applied between the first testing tips 201 and the second testing tips 203 to perform the electrical testing.

The semiconductor testing fixture may be able to perform an electrical testing on a plurality of tested packaging structures simultaneously. For example, the semiconductor testing fixture may perform an electrical testing on the first testing structure 300a and the second testing structure 300b, simultaneously. That is, the semiconductor testing fixture may perform the electrical testing on both the plurality of tested terminals 31 of the first tested packaged structure 300a and the plurality of tested terminals 31 of the second tested packaged structure 300b, simultaneously. Thus, the testing efficiency and the testing accuracy may be improved. Further, the semiconductor testing fixture may be applied to a manual testing, i.e., manually install the tested packaging structures; or an automatic testing, i.e., install the tested packaging structures by robots.

Figure 17:
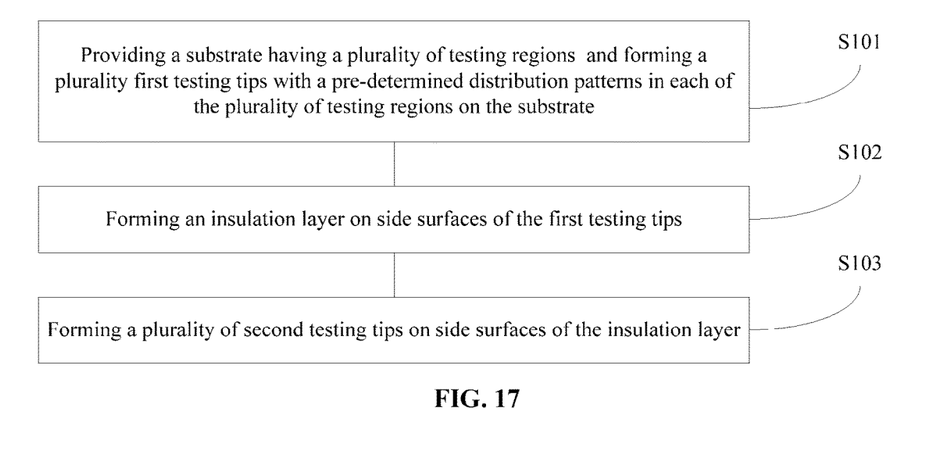
FIG. 17 illustrates an exemplary fabrication process of a semiconductor testing fixture consistent with the disclosed embodiments.

FIG. 17 illustrates an exemplary fabrication process of a semiconductor testing fixture consistent with the disclosed embodiment. FIGS. 6~12 illustrate structures corresponding certain stages of the exemplary fabrication process.

Figure 6:
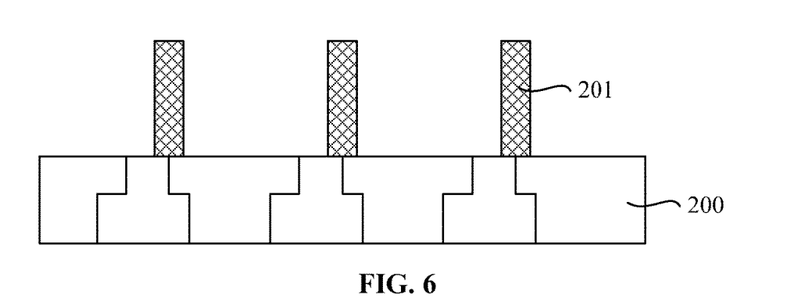
FIGS. 6~12 illustrate structures corresponding to certain stages of an exemplary fabrication process of a semiconductor testing fixture consistent with the disclosed embodiments.
Figure 14:
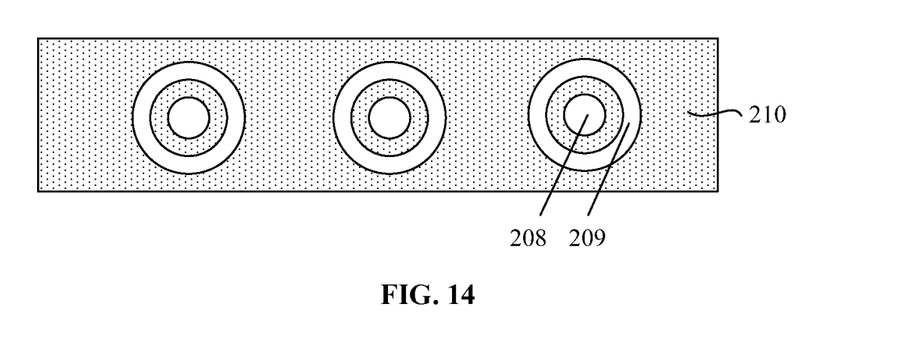

As show in FIG. 14, at the beginning of the fabrication process, a substrate with certain structures is provided (S101). FIG. 6 illustrates a corresponding structure.

As shown in FIG. 6, a substrate 200 in provided. The substrate 200 may have a plurality of testing regions (not labeled). Further, a plurality of first testing tips 201 may be formed on the substrate 200 in each of the testing regions. The plurality of the first testing tips 201 may be distributed in each of the testing regions with a predetermined pattern. In one embodiment, the plurality of the first testing tips 201 may be distributed in each of the testing regions as at least one row. In certain embodiments, the plurality of first testing tips 201 may be distributed in each of the testing regions as a standard array, or as rows with a staggered arrangement.

The number of the testing regions may be equal to or greater than two. The number of the rows in each of the testing regions may be equal to or greater than one. The number of the first testing tips 201 in each row may be equal to or greater than two.

One end of the first testing tip 201 connecting with the surface of the substrate 200 may be referred as a first connecting end. The other end (the end facing the first connecting end) of the first testing tip 201 may be referred as a first testing head.

In embodiment, a signal-transmitting circuit may be formed in the substrate 200. The signal transmitting circuit may include first input terminals (not labeled), second input terminals (not labeled), first output terminals (not labeled) and second output terminals (not labeled), etc. The first output terminal may be electrically connected with the first connecting end (not labeled) of the first testing tip 201; and the second output terminal may be electrically connected with the second connecting end (not labeled) of a subsequently formed second testing tip. The first input terminals and the second input terminals may be electrically connected with an external testing circuit. The external testing circuit may be used to provide testing signals. The signal transmitting circuit may be used to transmit the testing signals provided by the external testing circuit to the first testing tip 201 and the subsequently formed second testing tip; and transmit the electrical signals obtained from a testing process back to the external testing circuit. The external testing circuit may process the received electrical signals; and the testing parameters may be obtained.

Further, the substrate 200 may be made of PCB resin. First metal lines (not labeled) and second metal lines (not labeled) may be formed in the substrate 200. The first input terminals and the first output terminals may be electrically connected through the first metal lines formed in the substrate 200. The second input terminals and the second output terminals may be electrically connected through the second metal lines formed in the substrate 200.

In one embodiment, the substrate 200 may have a front surface and a facing back surface. The back surface of the substrate 200 may include interface regions. The plurality of first output terminals and the plurality of second output terminals may be disposed on the front surface of the substrate 200; and may be corresponding to the positions of the first testing tips 201 and the subsequently formed second testing tips. The plurality of first input terminals and the plurality of second input terminals may be integrated in the interface regions on the back surface of the substrate 200. Thus, the plurality of first input terminals and the plurality of second input terminals may be connected with the external testing circuit through one or more interfaces; and the interface circuit between the semiconductor testing fixture and the external testing circuit may be simplified.

In one embodiment, the substrate 200 may be formed by compressing a plurality of PCB boards. Each PCB board may include a plurality of interconnect structures. Each interconnect structure may include a plurality of through-board structures and metal layers formed on the surface of the PCB board and electrically connecting with through-board structures. When the plurality of PCB boards are compressed to form the substrate 200, the plurality of interconnect structures may form the first metal lines and the second metal lines. Thus, the plurality of first input terminals and the plurality of second input terminals may be integrated in the interface regions on the back face of the substrate 200.

In certain other embodiments, the substrate 200 may have a front surface and a facing back surface. The back surface of the substrate 200 may include interface regions. The plurality of first output terminals and the plurality of second output terminals may be disposed on the front surface of the substrate 200. A plurality of first through-board interconnect structures and a plurality of second through-board interconnect structures penetrating through the substrate 200 may be formed in the substrate 200. The first input terminals and the first output terminals may be electrically connected through the first through-board interconnect structures; and the second input terminals and the second output terminals may be electrically connected through the second through-board interconnect structures.

Further, a plurality of first redistribution metal layers and a plurality of second redistribution layers may be formed on the back surface of the substrate 200. One end of the first redistribution metal layer may be electrically connected with the first input terminal; and the other end of the first redistribution metal layer may be disposed in the interface region. One end of the second redistribution metal layer may be electrically connected with the second terminal; and the other end of the second redistribution metal layer may be disposed in the interface region. The first redistribution metal layers and the second redistribution layers may be electrically connected with the external testing circuit through one or more interfaces.

In certain other embodiments, a testing circuit (not shown) may be formed in the substrate 200. The testing circuit may include a first signal terminal and a second signal terminal. The first signal terminal may be electrically connected with the first connecting end of the first testing tip 201. The second signal terminal may be electrically connected with the second connecting end of the subsequently formed second testing tip. When the testing circuit is used to perform a test, testing signals, such as voltage signals or current signals, etc., may be applied onto the first testing tip 201 and the subsequent formed second testing tip; and received signals, such as current signals, etc., may be processed to obtain the testing parameters, such as resistance, etc.

In one embodiment, the substrate 200 may include a semiconductor substrate and a dielectric layer formed on the semiconductor substrate. The semiconductor substrate may be a silicon substrate, or a germanium substrate, etc. Semiconductor devices, such as transistors, etc., may be formed on the semiconductor substrate; and metal interconnect lines and passive devices, such as resistors and capacitors, etc., may be formed in the dielectric layer. The metal interconnect lines may electrically connect the semiconductor devices and the passive devices to form the testing circuit. The first signal terminal and the second signal terminal may be led out by the first metal lines and the second metal lines which are electrically connected with the testing circuit in the dielectric layer.

In one embodiment, the first testing tip 201 is a cylinder. Correspondingly, the cross-sectional view of the first testing tip 201 along a direction parallel to the surface of the substrate 200 is a circle. In certain other embodiments, the cross-sectional view of the first testing tip 201 may be any other appropriate shape, such as a triangle, or square, etc. The diameter of the first testing tip may be in a range of approximately 100 nm~500 µm.

In one embodiment, a process for forming the first testing tip 201 may include forming a sacrificial layer (not shown) having a plurality of through-holes with a predetermined distribution pattern and exposing the surface of the substrate 200 on the substrate 200 in each of the plurality of testing regions; filling the plurality of through-holes with a first metal layer to form the plurality of first testing tips 201; and removing the sacrificial layer. Thus, the plurality of first testing tips 201 with the predetermined distribution pattern may be formed in each of the testing regions.

The first metal layer may be formed by any appropriate process, such as a chemical vapor deposition (CVD) process, a physical vapor deposition (PVD) process, a flowable CVD (FCVD) process, or an electroplating process. In one embodiment, the first metal layer is formed by an electroplating process. Before the electroplating process, a conductive layer may be formed on the side and bottom surfaces of the through-holes. The conductive layer may be used as a cathode for the electroplating process.

The conductive layer may be a single layer structure, or a multiple-layer structure. The conductive layer may be made of one or more of Ti, Ta, TiN, and TaN, etc.

In one embodiment, the conductive layer is a double-layer structure. The double-layer structure may be a structure having a Ti layer and a TiN layer formed on the Ti layer, or a structure having a Ta layer and a TaN layer formed on the Ta layer.

The thickness of the conductive layer may be smaller than the diameter of the through-holes. In one embodiment, the thickness of the conductive layer may be in a range of approximately 50 nm~200 nm.

Various processes may be used to form the conductive layer. In one embodiment, the conductive layer is formed by a sputtering process.

After forming the conductive layer, an electroplating process may be performed to form the first metal layer. The first metal layer may be formed on the conductive layer; and may fill the through-holes. After the electroplating process, a chemical mechanical polishing (CMP) process may be performed to remove portions of the first metal layer and the conductive layer on the surface of the sacrificial layer. Thus, the first testing tips 201 may be formed. Therefore, the first testing tips 201 may include a portion of the first metal layer and a portion of the conductive layer covering the portion of the first metal layer. The portion of the conductive layer may be used as a diffusion barrier layer to prevent the metal of the first metal layer from diffusing into a subsequently formed insulation layer. The first metal layer may be made of any appropriate material, such as Cu, Au, W, or metal alloy, etc.

In certain other embodiments, a process for forming the plurality of the first testing tips 201 may include forming a first metal layer (not labeled) on the substrate 200; forming a patterned mask layer (not shown) on the first metal layer; etching the first metal layer using the patterned mask layer as an etching mask to form the plurality of first testing tips 201; and removing the patterned mask layer. Thus, the plurality of first testing tips 201 with the predetermined pattern may be formed on the substrate 200.

Figure 7:
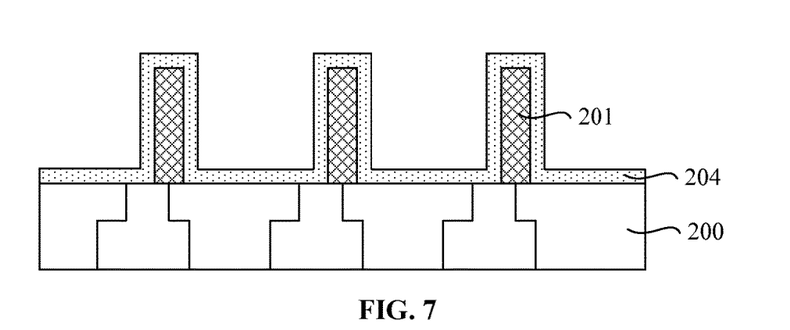
Figure 8:
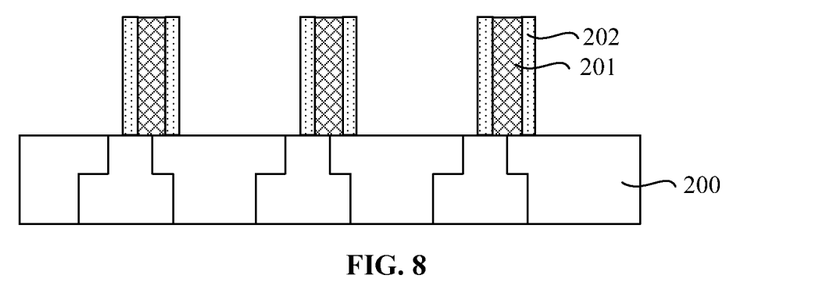

Returning to FIG. 17, after forming the plurality of first testing tips 201, an insulation layer may be formed (S102). FIGS. 7~8 illustrate corresponding structures.

As shown in FIG. 8, an insulation layer 202 is formed on the side surface of each of the plurality of first testing tips 201. The insulation layer 202 may be a single layer structure or a multiple-layer structure. The insulation layer 202 may be made of any appropriate material, such as one or more of silicon oxide, silicon nitride, silicon oxynitride, and silicon carbonitride, etc. The thickness of the insulation layer 202 may be in a range of approximately 80 nm~400 μm.

A process for forming the insulation layer 202 may include forming an insulation film 204 on the side surfaces of the first testing tips 201 and the surface of the substrate 200 (as shown in FIG. 7). That is, the insulation film 204 may cover the entire first testing tips 201. The process also include performing a mask-less etching process (etch-back) process on the insulation film 204. Thus, the insulation layer 202 is formed on the side surface of each first testing tips 201 (as shown in FIG. 8).

In one embodiment, the insulation layer 202 is made of silicon oxide. The insulation film 204 may be formed by any appropriate process, such as a CVD process, a PVD process, or an FCVD process, etc.

In certain other embodiments, the insulation layer 202 may be made of resin material. The resin material may include epoxy, polyimide, polyethylene, benzocyclobutene, or polybenzoxazole, etc. The insulation film 204 may be formed by a screen-printing process, etc.

The mask-less etching process may be any appropriate process. In one embodiment, the mask-less etching process is an anisotropic plasma etching process. In one embodiment, the etching gas of the anisotropic plasma etching process may include fluoride and carbon-containing gas, etc. Specifically, the etching gas may include one or more $CF_4$, $C_2F_6$, $C_4F_8$, $CHF_3$, and $CH_2F_2$. The source power of the plasma may be in a range of approximately 500 W~1000 W. The bias power of the plasma may be in a range of 0~100 W. The pressure of the etching chamber may be in a range of approximately 2 mTorr~500 mTorr.

Figure 9:
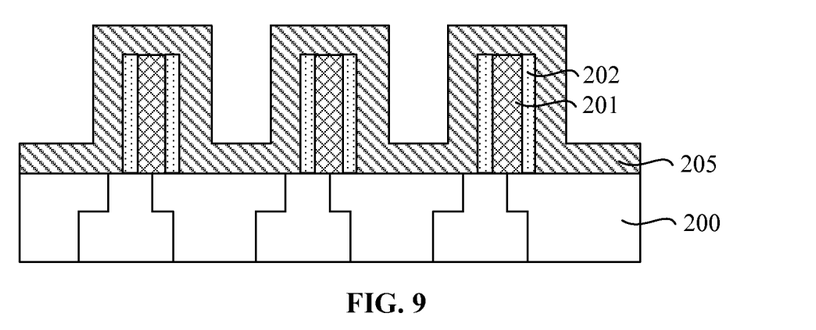
Figure 10:
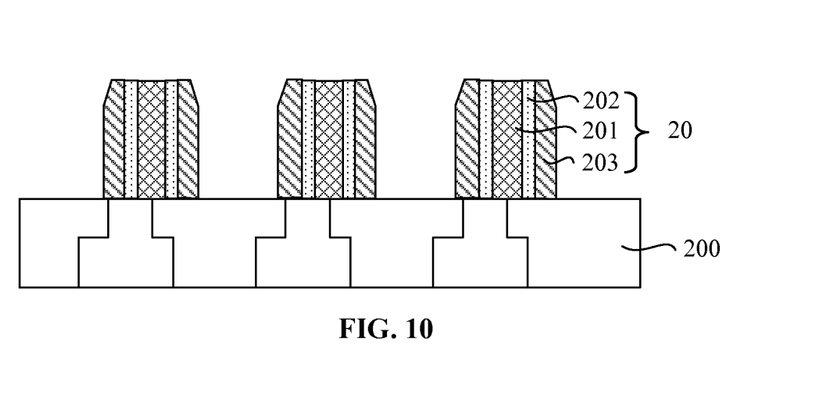

Returning to FIG. 17, after forming the insulation layer 202, a plurality of second testing tips may be formed (S103). FIGS. 9~10 illustrate corresponding structures.

As shown in FIG. 10, a second testing tip 203 is formed on the insulation layer 202 on each of the first testing tips 201. The second testing tip 203 may surround the first testing tip 201. Further, the second testing tip 203 may be coaxial with the first testing tip 201. One end of the second testing tip 203 connecting with the surface of the substrate 200 may be referred as a second connecting end; and the other end (facing the second connecting end) of the second testing tip 203 may be referred as a second testing head. The second testing head of the second testing tip 203 may be level with the first testing head of the first testing tip 201. The second testing head and the second testing head may be connected with the surface of a tested terminal during a testing process.

A process for forming the second testing tips 203 may include forming a second metal layer 205 covering the top surfaces of the insulation layer 202 and the first testing tips 201, the side surface of the insulation layer 202 and the surface of the substrate 200 (as shown in FIG. 9); and performing a mask-less etching process to remove portions of the second metal layer 205 on the top surfaces of the insulation layer 202 and the first testing tips 201 and the surface of the substrate 200. Thus, as shown in FIG. 10, the second testing tips 201 may be formed.

Each of the first testing tips 201 and the corresponding insulation layer 202 and the corresponding second testing tip 203 may form a testing probe 20. Thus, a plurality of testing probes 20 may be formed on the substrate 200. The plurality of testing probes 20 may be distributed as the predetermined pattern in each of the testing regions The second metal layer 205 may be made of any appropriate material, such as Cu, Au, W, or metal alloy, etc. The thickness of the second metal layer 205 may be in a range of approximately 60 nm~300 μm.

Various processes may be used to form the second metal layer 205, such as a CVD process, a PVD process, an FCVD process, an electroplating process, or a sputtering process, etc. In one embodiment, the second metal layer 205 is formed by a sputtering process.

The mask-less etching process may be any appropriate process. In one embodiment, the mask-less etching process is an anisotropic plasma etching process. The etching gas of the plasma etching process may include one or more of $SF_6$, $NF_3$, $Cl_2$, and HBr, etc. The source power of the plasma may be in a range of approximately 500 W~1500 W. The bias power of the plasma may be in a range of approximately 0~100 W. The pressure of the etching chamber may be in a range of approximately 10 mTorr~500 mTorr.

Figure 11:
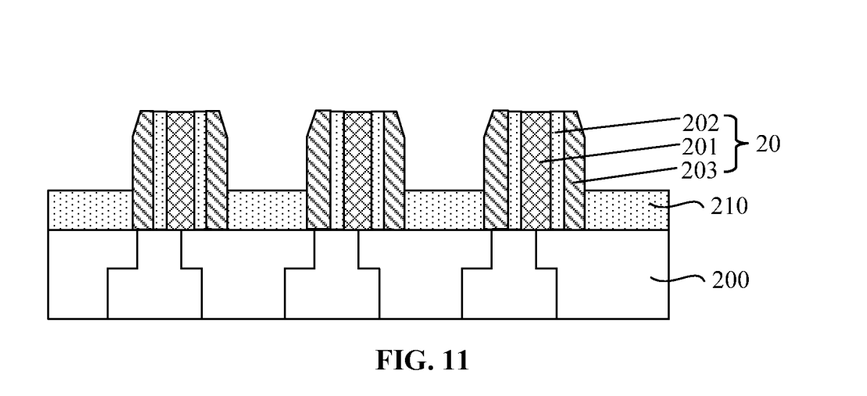

Optionally and additionally, as shown in FIG. 11, after forming the plurality of the testing probes 20, a dielectric layer 210 may be formed on the surface of the substrate 200.

The dielectric layer 210 may fill the space between adjacent testing probes 20. In one embodiment, the dielectric layer may cover portions of the side surfaces of the second testing tips 203. That is, the top surface of the dielectric layer 201 may be lower than the top surfaces of the testing probes 20.

A process for forming the dielectric layer 210 may include forming a dielectric material film covering the surface of the testing probes 20 on the surface of the substrate 200; planarizing the dielectric film using the top surface of the testing probes 20 as a polishing stop layer; and etching-back the planarized dielectric film to cause the top surface of the planarized film to be lower than the top surfaces of the testing probes 20. Thus, the dielectric layer 210 may be formed.

The dielectric layer 210 may be made of any appropriate material, such as silicon oxide, silicon nitride, silicon oxynitride, silicon carbonitride, or resin (epoxy, or polyimide, etc.) etc. In one embodiment, when the dielectric material is made of one of silicon oxide, silicon nitride, silicon oxynitride, and silicon carbonitride, the dielectric material film may be formed by a CVD process. In certain other embodiments, the dielectric material layer may be made of resin material, the dielectric material film may be formed by a wet-coating process, or a screen-printing process.

Figure 12:
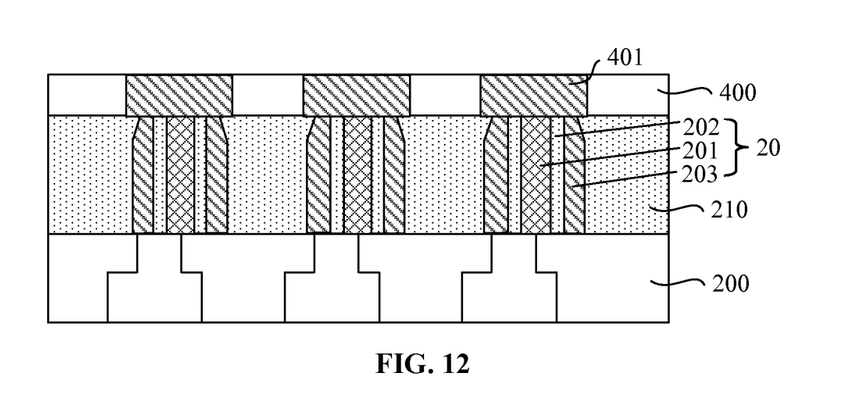

Optionally and additionally, as shown in FIG. 12, in certain other embodiments, after forming the plurality of testing probes 20, a dielectric layer 210 may be formed on the surface of the substrate 200. Further, a transition board 400 may be formed on the dielectric layer 210.

The dielectric layer 210 may fill the space between adjacent testing probes 20. The dielectric layer may cover the entire side surfaces of the second testing tips 203. Further, the top surface of the dielectric layer 201 may level with the top surfaces of the testing probes 20. The transition board 400 may include an insulation layer (not labeled) formed on the top surface the dielectric layer 210 and metal blocks 401 formed on the top surfaces of the testing probes 20 and in the insulation layer.

A process for forming the transition board 400 may include forming the insulation layer having a plurality of openings (not labeled) exposing the top surfaces of the testing probes 20 on the dielectric layer 210; and filling metal material in the openings to form the metal blocks 401 in the openings.

The insulation layer may be made of any appropriate material, such as silicon oxide, silicon nitride, silicon oxynitride, silicon carbonitride, or resin (epoxy, or polyimide, etc.) etc. The insulation layer having the plurality of openings may be formed by forming an insulation material layer; and etching the insulation material layer to expose the testing probes 20 to form the plurality of openings.

The size of the openings may be greater than the size of the top surfaces of the testing probes 20. Thus, the openings may expose the entire top surfaces of the testing probes 20. Accordingly, the metal blocks 401 formed in the openings may connect the entire top surfaces of the testing probes 20.

A process for forming the metal blocks 401 may include forming a metal layer filling the openings on the insulation layer; and performing a CMP process to remove the portion of the metal layer on the surface of the insulation layer. Thus, the metal blocks 401 may be formed.

The metal layer may be made of any appropriate material, such as W, Al, Cu, Ti, Au, Pt, Ni or metal alloy, etc. The metal layer may be formed by a sputtering process, or an electroplating process, etc.

Figure 18:
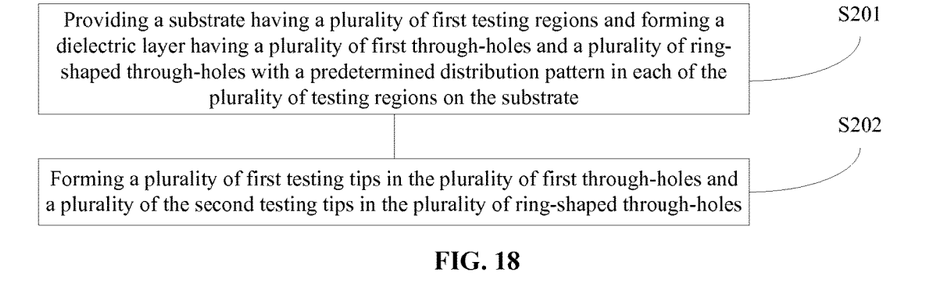
FIG. 18 illustrates another exemplary fabrication process of a semiconductor testing fixture consistent with the disclosed embodiments.

FIG. 18 illustrates another exemplary fabrication process of a semiconductor testing fixture consistent with the disclosed embodiment. FIGS. 13~16 illustrate structures corresponding certain stages of the exemplary fabrication process.

Figure 13:
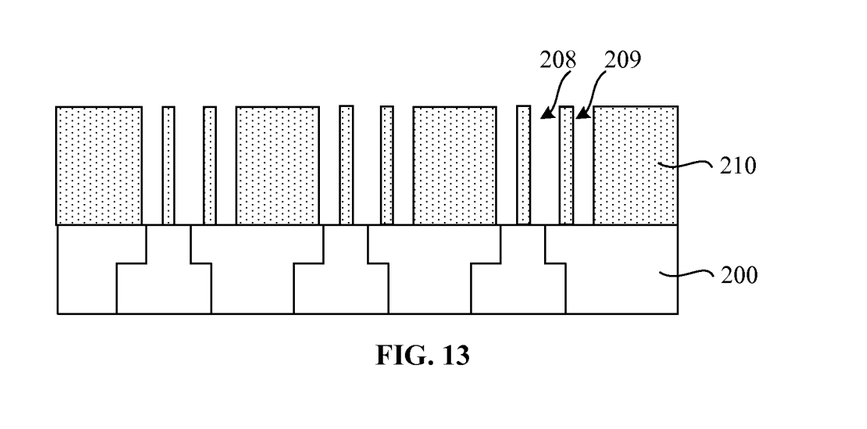
FIGS. 13~16 illustrate structures corresponding to certain stages of another exemplary fabrication process of a semiconductor testing fixture consistent with the disclosed embodiments.
Figure 15:
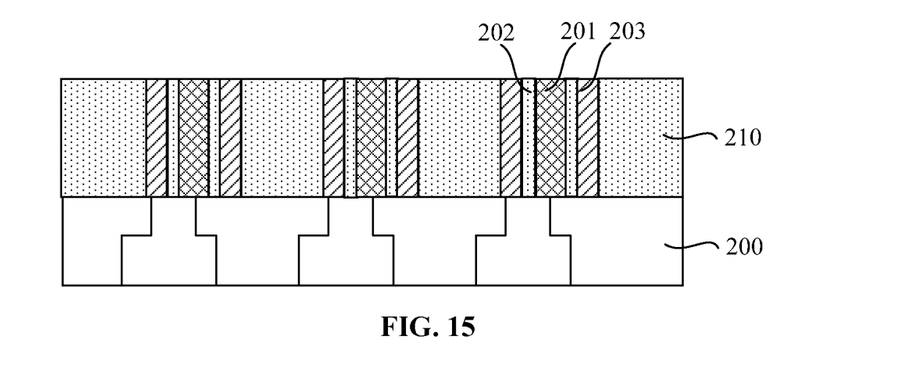

As shown in FIG. 15, at the beginning of the fabrication process, a substrate with certain structures is provided (201). FIGS. 13~14 illustrates a corresponding structure. FIG. 14 is a top-view of the structure illustrated in FIG. 13.

As shown in FIGS. 13~14, a substrate 200 having a plurality of testing regions (not labeled) is provided. Further, a dielectric layer 210 is formed on the substrate 200. The dielectric layer 210 in each of the testing regions may have a plurality of first through-holes 208 with a predetermined distribution pattern, and a plurality of ring-shaped through holes 209 surrounding the first through-holes 208. The first through-holes 208 may be insulated from the ring-shaped through-holes 209 by portions of the dielectric layer 210. Further, each of the first though-holes 208 may be coaxial with a surrounding ring-shaped through-hole 209.

The number of the testing regions may be equal to or greater than two. The number of rows of the first through-holes 208 in the dielectric layer 210 in each region may be equal to, or greater than one. The number of the first through-holes 208 in each row may be greater than two.

The top view of the first through-holes 208 may be circular; and the top view of the ring-shaped through holes 209 may be ring-shaped. In certain other embodiments, the top view of the first through-holes 208 may be any other appropriate shape, such as triangle, rectangle, or square, etc.

The first through-holes 208 may expose the surface of the substrate 200 and be used for subsequently forming first testing tips. The ring-shaped through-holes 209 may expose the surface of the substrate; and may be used for subsequently forming second testing tips. The subsequently formed first testing tips, the subsequently formed second testing tip and the portions of the dielectric layer 210 insulating the first through-holes 208 and the ring-shaped through-holes 209 may form a plurality of testing probes with the predetermined distribution pattern on the substrate 200 in each of the plurality of the testing regions.

One end of the subsequently formed first testing tip connecting with the surface of the substrate 200 may be referred as a first connecting end; and the other end of the subsequently formed first testing tip may be referred a first testing head. One end of the subsequently formed second testing tip connecting with the surface of the substrate 200 may be referred as a second connecting end; and the other end of the subsequently formed second testing tip may be referred a second testing head. The first testing head may level with the second testing head.

In embodiment, a signal-transmitting circuit may be formed in the substrate 200. The signal transmitting circuit may include first input terminals (not labeled), second input terminals (not labeled), first output terminals (not labeled) and second output terminals (not labeled), etc. The first output terminal may be electrically connected with the first connecting end of the subsequently formed first testing tip; and the second output terminal may be electrically connected with the second connecting end (not labeled) of the subsequently formed second testing tip.

The first input terminals and the second input terminals may be electrically connected with an external testing circuit. The external testing circuit may be used to provide testing signals. The signal-transmitting circuit may be used to transmit the testing signals provided by an external testing circuit to the subsequently formed first testing tip and the subsequently formed second testing tip; and transmit the electrical signals obtained from the testing process back to the external testing circuit. The external testing circuit may process the received electrical signals; and the testing parameters may be obtained.

Further, first metal lines (not labeled) and second metal lines (not labeled) may be formed in the substrate 200. The first input terminals and the first output terminals may be electrically connected through the first metal lines formed in the substrate 200. The second input terminals and the second output terminals may be electrically connected through the second metal lines formed in the substrate 200.

In one embodiment, the substrate 200 may have a front surface and a facing back surface. The back surface of the substrate 200 may include interface regions. The plurality of first output terminals and the plurality of second output terminals may be disposed on the front surface of the substrate 200; and may be corresponding to the positions of the subsequently formed first testing tips and the subsequently formed second testing tips. The plurality of first input terminals and the plurality of second input terminals may be integrated in the interface regions on the back surface of the substrate 200. Thus, the plurality of first input terminals and the plurality of second input terminals may be connected with the external testing circuit through one or more interfaces; and the interface circuit between the semiconductor testing fixture and the external testing circuit may be simplified.

In one embodiment, the substrate 200 may be formed by compressing a plurality of PCB boards. Each PCB board may include a plurality of interconnect structures. Each interconnect structure may include a plurality of through-board structures and metal layers formed on the surface of the PCB board and electrically connecting with through-board structures. When the plurality of PCB boards are compressed to form the substrate 200, the plurality of interconnect structures may form the first metal lines and the second metal lines. Thus, the plurality of first input terminals and the plurality of second input terminals may be integrated in the interface regions on the back face of the substrate 200.

In certain other embodiments, the substrate 200 may have a front surface and a facing back surface. The back surface of the substrate 200 may include interface regions. The plurality of first output terminals and the plurality of second output terminals may be disposed on the front surface of the substrate 200. A plurality of first through-board interconnect structures and a plurality of second through-board interconnect structures penetrating through the substrate 200 may be formed in the substrate 200. The first input terminals and the first output terminals may be electrically connected through the first through-board interconnect structures; and the second input terminals and the second output terminals may be electrically connected through the second through-board interconnect structures.

Further, a plurality of first redistribution metal layers and a plurality of second redistribution layers may be formed on the back surface of the substrate 200. One end of the first redistribution metal layer may be electrically connected with the first input terminal; and the other end of the first redistribution metal layer may be disposed in the interface region. One end of the second redistribution metal layer may be electrically connected with the second terminal; and the other end of the second redistribution metal layer may be disposed in the interface region. The first redistribution metal layers and the second redistribution layers may be electrically connected with the external testing circuit through one or more interfaces.

In certain other embodiments, a testing circuit (not shown) may be formed in the substrate 200. The testing circuit may include a first signal terminal and a second signal terminal. The first signal terminal may be electrically connected with the first connecting end of the subsequently formed first testing tip. The second signal terminal may be electrically connected with the second connecting end of the subsequently formed second testing tip. When the testing circuit is used to perform a test, testing signals, such as voltage signals or current signals, etc., may be applied onto the subsequently formed first testing tip and the subsequent formed second testing tip; and received signals, such as current signals, etc., may be processed to obtain the testing parameters, such as resistance, etc.

The dielectric layer 210 may be made of any appropriate material, such as one or more of silicon oxide, silicon nitride, silicon oxynitride, and silicon carbonitride, etc. Various processes may be used to form the dielectric layer 210, such as a CVD process, a PVD process, or an FCVD process, etc. In one embodiment, the dielectric layer 210 is formed by a CVD process.

After forming a dielectric material layer by a CVD process, a patterned mask layer may be formed on the dielectric material layer. Then, the plurality of first through-holes 208 and the corresponding ring-shaped through-holes 209 may be formed by etching the dielectric material layer using the patterned mask layer as an etching mask to form the dielectric layer 210. After forming the dielectric layer 210 having the plurality of the first through-holes 208 and the plurality of ring-shaped through-holes 209, the patterned mask layer may be removed.

The dielectric material layer may be etched by any appropriate process, such as a dry etching process, a wet etching process, or an ion beam etching process, etc. The patterned mask layer may be removed by any appropriate process, such as a dry etching process, a wet etching process, or a plasma ashing process, etc.

In certain other embodiments, the dielectric layer 210 may be made of resin material. The resin material may include epoxy, polyimide, polyethylene, benzocyclobutene, or polybenzoxazole, etc. The dielectric layer 210 made of resin may be formed by a dry-coating process, a wet-coating process, a screen-printing process, or a roll-coating process, etc.

After forming a dielectric film made of the resin, an exposure process and a developing process may be performed to form the plurality of first through-holes 208 and the corresponding ring-shaped through-holes 209. Thus, the dielectric layer 210 made of the resin may be formed. By using such a process, the fabrication process of the dielectric layer 210 may be simplified.

Returning to FIG. 18, after forming the dielectric layer 210, a plurality of first testing tips and a plurality of second tips may be formed (S202). FIG. 15 illustrates a corresponding structure.

As shown in FIG. 15, a first testing tip 201 is formed in each of the plurality of first through-holes 208; and a second testing tip 203 is formed in each of the plurality of ring-shaped through-holes 209. The first testing tips 201 and the second testing tips 203 may be formed by a same step. In certain other embodiments the first testing tips 201 and the second testing tips 202 may be formed by separated steps.

The first testing tips 201 and the second testing tips 203 may be formed by any appropriate process, such as a CVD process, a PVD process, an FCVD process, a sputtering process, or an electroplating process, etc. In one embodiment, the first testing tips 201 and the second testing tips 203 are formed by an electroplating process.

Before the first testing tips 201 and the second testing tips 203 are formed by an electroplating process, a conductive layer (not shown) may be formed on the side surfaces and bottoms of the first through-holes 208 and the ring-shaped through-holes 209 and the surface of the dielectric layer 210. The conductive layer may be used as a cathode for the electroplating process.

The conductive layer may be a single layer structure, or a multiple-layer structure. The conductive layer may be made of any appropriate material, such as one or more of Ti, Ta, TiN, and TiN, etc. In one embodiment, the conducive layer is a double-layer structure. The double-layer structure may be a structure having a Ti layer and a TiN layer formed on the Ti layer, or a structure having a Ta layer and a TaN layer formed on the Ta layer.

Various processes may be used to form the conductive layer, such as a CVD process, a PVD process, or an FCVD process, etc. In one embodiment, the conductive layer is formed by a sputtering process.

The thickness of the conductive layer may be smaller than the smallest radius of one of the radius of the first through-holes 208 and the radius of the ring-shaped through-holes 209.

After forming the conductive layer, the electroplating process may be formed to form a metal layer. The metal layer may be on the conductive layer and may fill the first through-holes 208 and the ring-shaped through-holes 209. After the electroplating process, a CMP process may be performed to remove portions of the conductive layer and the metal layer on the surface of the insulation layer 210. Thus, the first testing tips 201 and the second testing tips 203 may be formed. The first testing tips 201 and the second testing tips 203 may all include portions of the conductive layer and portions of the metal layer covered by the portions of the conductive layer. The portions of the conductive layer may be used as a diffusion barrier layer to prevent the metal in the metal layer from diffusing into the dielectric layer 210. The metal layer may be made of any appropriate material, such as Cu, Au, W, or metal alloy, etc.

In one embodiment, the first testing tips 201 and the second testing tips 203 may be formed by the electroplating process simultaneously. Thus, the first testing tips 201 and the second testing tips 203 may not be damaged by etching processes. Therefore, the morphology of the first testing tips 201 and the second testing tips 203 may be as desired.

Optionally and additionally, after forming the first testing tips 201 and the second testing tips 203, an etch back process may be performed to cause the surface of the dielectric layer 210 outside of the second testing tips 203 to be lower than the top surfaces of the first testing tips 201, the second testing tips 203 and the portions of the dielectric layer 210 between the first testing tips 201 and the second testing tips 203. The portions of the dielectric layer 210 between the first testing tips 201 and the second testing tips 203 may be configured as an insulation layer 202 of testing probes 20. Thus, a plurality of testing probes 20 may be formed on the substrate 200 in each of the testing regions. The plurality of testing probes 20 in each of the testing regions may be distributed with the predetermined pattern, such as at least one row, or rows with the staggered arrangements, etc.

Figure 16:
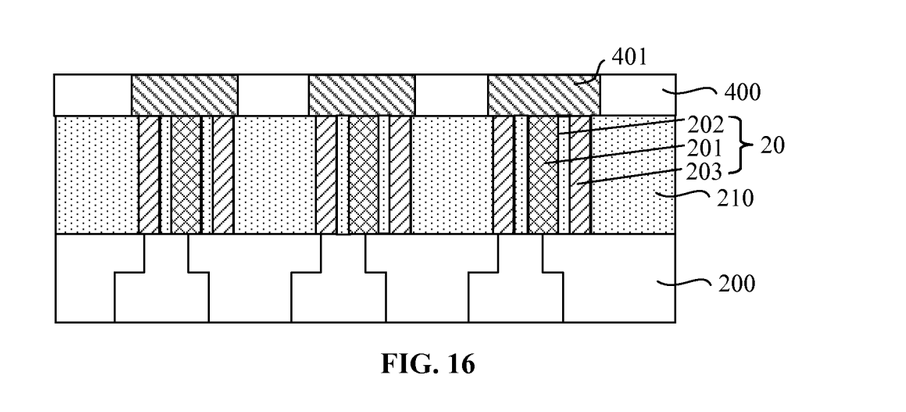

Optionally and additionally, as shown in FIG. 16, in certain other embodiments, after forming the plurality of the testing probes 20, a transition board 400 may be formed on the insulation layer 210. The transition board 400 may include an insulation layer (not labeled) formed on the top surface the dielectric layer 210 and metal blocks 401 formed on the top surfaces of the testing probes 20.

A process for forming the transition board 400 may include forming the insulation layer having a plurality of openings (not labeled) exposing the top surfaces of the testing probes 20 on the dielectric layer 210; and filling metal material in the openings to form the metal blocks 401 in the openings.

The insulation layer may be made of any appropriate material, such as silicon oxide, silicon nitride, silicon oxynitride, silicon carbonitride, or resin (epoxy, or polyimide, etc.) etc. The insulation layer having the plurality of openings may be formed forming an insulation material layer; and etching the insulation material layer to expose the testing probes 20 to form the plurality of openings.

The size of the openings may be greater than the size of the top surfaces of the testing probes 20. Thus, the openings may expose the entire top surfaces of the testing probes 20. Accordingly, the metal blocks 401 formed in the openings may be connected with the entire top surfaces of the testing probes 20.

A process for forming the metal blocks 401 may include forming a metal layer filling the openings on the insulation layer; and performing a CMP process to remove the portion of the metal layer on the surface of the insulation layer. Thus, the metal blocks 401 may be formed.

The metal layer may be made of any appropriate material, such as W, Al, Cu, Ti, Au, Pt, Ni, or metal alloy, etc. The metal layer may be formed by a sputtering process or an electroplating process, etc.

According to the disclosed methods and structures, the first testing tip and the second testing tip may be integrated in one testing probe. The second testing tip may surround the first testing tip; and the second testing tip and the first testing tip may be insulated by an insulation layer. Thus, the mechanical strength of the testing probe may be improved when the size of the testing probe is substantially small.

Further, because the first testing tip and the second testing tip may be coaxially distributed, the distance accuracy between the first testing tip and the second testing tip may be significantly high. Thus, the testing accuracy may be improved.

Further, the first testing tip and the second testing tip may be integrated into a single testing probe. Thus, a single testing probe may be used as stand-alone to perform an electrical testing.

Further, the substrate may include a plurality of testing regions. Each of the plurality regions may have a plurality of testing probes distributed with a predetermined pattern. Each testing region may be used test a plurality of tested terminals in a packaging structure. Thus, the disclosed semiconductor testing fixture may be used to test a plurality of packaging structures simultaneously. Therefore, the testing efficiency and accuracy may be increased.

Further, the plurality of testing probes in each of the testing regions may be distributed a plurality of rows with a staggered arrangement. Thus, more testing probes may be disposed in same area; and the distance between adjacent testing probes may be reduced. Accordingly, it may be able to perform electrical testing on the tested terminals with substantially small distances.

Further, the semiconductor testing fixture may be formed by a microfabrication process. Thus, the size and morphology of the plurality of testing probes in each of the plurality of testing region may be similar; and the distances between adjacent testing probes may be similar. When the semiconductor testing fixture is used to perform an electrical test, the testing accuracy may be increased.

Further, a signal-transmitting circuit may be formed in the substrate of the semiconductor testing fixture, it may be convenient to transmit and receive the testing signals. Further, the integration level of the semiconductor testing fixture may also be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A semiconductor testing fixture, comprising:
   a substrate having a plurality of testing regions;
   a plurality of testing probes with a predetermined distribution pattern formed on the substrate in each of the plurality of testing regions; and
   a dielectric layer filling a space between two of the plurality of testing probes,
   wherein each of the plurality of testing probes comprises:
     a first testing tip;
     an insulation layer formed on a side surface of the first testing tip; and
     a second testing tip being coaxial with the first testing tip and surrounding the first testing tip formed on a side surface of the insulation layer, and an end surface of the insulation layer levels with an end surface of the first testing tip and an end surface of the second testing tip.

2. The semiconductor testing fixture according to claim 1, wherein:
   the plurality of testing probes in each of the plurality of the testing regions are distributed as at least one row.

3. The semiconductor testing fixture according to claim 1, wherein:
   the plurality of testing probes in each of the plurality of the testing regions are distributed as rows with a staggered arrangement.

4. The semiconductor testing fixture according to claim 1, wherein the first testing tip further comprises:
   a first tip body with one end being configured as a first testing head and the other end being configured as a first connecting end.

5. The semiconductor testing structure according to claim 4, wherein the second testing tip further comprises:
   a second tip body with one end being configured as a second testing head leveling with the first testing head of the first testing tip and the other end being configured as a second connecting end.

6. The semiconductor testing fixture according to claim 5, wherein the substrate further comprises:
   a signal transmitting circuit including a first output terminal electrically connected with the first connecting end of the first testing tip, a second output terminal electrically connected with the second connecting end of the second testing tip, and a first input terminal and a second input terminal electrically connected with an external testing circuit.

7. The semiconductor testing fixture according to claim 5, wherein:
   the first testing tip is a cylinder;
   a diameter of the first testing tip is in a range of approximately 500 nm to 500 μm;
   a width of the insulation layer is in a range of approximately 80 nm to 400 μm; and
   a width of the second testing tip is in a range of approximately 60 nm to 300 μm.

8. The semiconductor testing fixture according to claim 1, wherein:
   the insulation layer is made of one of silicon oxide, silicon nitride, silicon oxynitride, silicon carbonitride, and resin material.

9. The semiconductor testing fixture according to claim 1, further comprising:
   a transition board having a second insulation layer and a plurality of metal blocks in the second insulation layer formed over the plurality of the testing probes.

10. A method for fabricating a semiconductor testing fixture, comprising:
    providing a substrate having a plurality of testing regions; and
    forming a plurality of testing probes with a predetermined distribution pattern on the substrate in each of the plurality of testing regions, comprising:
      forming a first metal layer on a surface of the substrate;
      forming a plurality of first testing tips with the predetermined distribution pattern on the substrate in each of the plurality of testing regions by etching the first metal layer;
      forming an insulation material layer covering top and side surfaces the plurality of first test tips on the surface of the substrate;
      performing a mask-less etching process on the insulation layer to form an insulation layer on side surfaces of the first testing tips;
      forming a second metal layer covering side surfaces of the insulation layer and the top surfaces of the first testing tips on the surface of the substrate; and
      performing a mask-less etching process to form the second testing tips on the side surfaces of the insulation layer,
    wherein each of the plurality of testing probes comprises:
      a first testing tip;
      an insulation layer formed on a side surface of the first testing tip; and
      a second testing tip being coaxial with the first testing tip and surrounding the first testing tip formed on a side surface of the insulation layer.

11. The method according to claim 10, wherein:
    the plurality of testing probes in each of the plurality of testing regions are distributed as at least one row.

12. The method according to claim 10, wherein:
    the plurality of the first testing probes in each of the plurality of testing regions are distributed as rows having a staggered arrangement.

13. The method according to claim 10, after forming the plurality of testing probes in each of the plurality of testing regions, further comprising:
    forming a dielectric layer filling spaces between adjacent testing probes on the surface of the substrate.

14. The method according to claim 10, wherein forming the plurality of testing probes in each of the plurality of testing regions further comprises:
    forming a sacrificial layer having a plurality of openings with a predetermined distribution patterns and exposing the surface of the substrate on the substrate in each of the plurality of testing regions;
    forming the first testing tip in etch of the plurality of openings by filling metal in the plurality of openings;
    removing the sacrificial layer;

forming the insulation material layer covering top and side surfaces the first test tips on the surface of the substrate;
performing the mask-less etching process on the insulation layer to form an insulation layer on side surfaces of the first testing tips;
forming the second metal layer covering side surfaces of the insulation layer and the top surfaces of the first testing tips on the surface of the substrate; and
performing the mask-less etching process to form second testing tips on the side surfaces of the insulation layer.

15. The method according to claim 14, after forming the plurality of testing probes on the substrate in each of the plurality of testing regions, further comprising:
forming a dielectric layer filling spaces between adjacent testing probes on the surface of the substrate.

16. The method according to claim 10, wherein forming the plurality of testing probes on the substrate in each of the plurality of testing regions further comprises:
forming a dielectric layer on the surface of the substrate;
forming a plurality of first through-holes with the predetermined distribution pattern and a plurality of ring-shaped through-holes being coaxial with the first through-holes and surrounding the first through-holes in the dielectric layer in each of the plurality of testing region; and
forming a first testing tip in each of the plurality of first through-holes and a second testing tip in each of the plurality of ring-shaped through-holes.

17. The method according to claim 16, further comprising:
forming a transition board having an insulation layer and a plurality of metal blocks in the insulation layer with the metal blocks being connected with the plurality of testing probes over the dielectric layer.

18. The method according to claim 10, wherein:
the substrate includes a signal transmitting circuit configured to send testing signal to the plurality of the testing probes and receive electrical signals from the plurality of testing probes.

* * * * *